(12) United States Patent
Wolf et al.

(10) Patent No.: US 9,759,550 B2
(45) Date of Patent: Sep. 12, 2017

(54) PROJECTION EXPOSURE APPARATUS FOR MICROLITHOGRAPHY COMPRISING AN OPTICAL DISTANCE MEASUREMENT SYSTEM

(71) Applicant: Carl Zeiss SMT GmbH, Oberkochen (DE)

(72) Inventors: Alexander Wolf, Oberkochen (DE); Markus Schwab, Aalen (DE); Toralf Gruner, Aalen-Hofen (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/598,913

(22) Filed: Jan. 16, 2015

(65) Prior Publication Data

US 2015/0198437 A1 Jul. 16, 2015

Related U.S. Application Data

(63) Continuation of application No. PCT/EP2013/002074, filed on Jul. 12, 2013.

(30) Foreign Application Priority Data

Jul. 19, 2012 (DE) .................. 10 2012 212 663

(51) Int. Cl.
*G01B 11/14* (2006.01)
*G03F 7/20* (2006.01)
(Continued)

(52) U.S. Cl.
CPC ............ *G01B 11/14* (2013.01); *G03F 7/7085* (2013.01); *G03F 7/70775* (2013.01);
(Continued)

(58) Field of Classification Search
CPC ... G01B 11/14; G03F 7/7085; G03F 7/70775; H01J 37/317
See application file for complete search history.

(56) References Cited

U.S. PATENT DOCUMENTS

| 6,122,058 A | 9/2000 | Van Der Werf et al. |
| 2004/0227107 A1 | 11/2004 | Cox et al. |

(Continued)

FOREIGN PATENT DOCUMENTS

| EP | 0961914 A1 | 12/1992 |
| EP | 2149778 A1 | 2/2010 |

(Continued)

OTHER PUBLICATIONS

"LIDAR system pinpoints multiple onjects with nanometer precision from >60 miles away", Opto IQ, May 27, 2009.
(Continued)

*Primary Examiner* — Christine Sung
(74) *Attorney, Agent, or Firm* — Edell, Shapiro 7 Finnan, LLC

(57) ABSTRACT

A projection exposure apparatus (10) for microlithography has a plurality of optical components (M1-M6) forming an exposure beam path, as well as a distance measurement system (30, 130, 230) configured to measure a distance between at least one of the optical components and a reference element (40, 140, 240). The distance measurement system comprises a frequency comb generator (32, 132, 232), which is configured to generate electromagnetic radiation (36, 236) having a comb-shaped frequency spectrum.

20 Claims, 4 Drawing Sheets

(51) Int. Cl.
*H01J 37/317* (2006.01)
*H05G 2/00* (2006.01)

(52) U.S. Cl.
CPC ............ *H01J 37/317* (2013.01); *H05G 2/008* (2013.01); *H01J 2237/0203* (2013.01); *H01J 2237/31777* (2013.01)

(56) References Cited

U.S. PATENT DOCUMENTS

| | | | |
|---|---|---|---|
| 2004/0227915 | A1 | 11/2004 | Ohtsuka |
| 2009/0207418 | A1 | 8/2009 | Kim et al. |
| 2010/0091296 | A1 | 4/2010 | de Groot et al. |
| 2010/0110444 | A1 | 5/2010 | Kuramoto |
| 2011/0285980 | A1 | 11/2011 | Newbury et al. |
| 2012/0033197 | A1* | 2/2012 | Minegishi ............ G01S 17/36 356/5.09 |

FOREIGN PATENT DOCUMENTS

| | | | |
|---|---|---|---|
| JP | 2004343078 | A | 12/2004 |
| JP | 2010014549 | A | 1/2010 |
| JP | 2010038552 | A | 2/2010 |
| JP | 2010112768 | A | 5/2010 |
| JP | 2010203884 | A | 9/2010 |
| WO | 2010006764 | A2 | 1/2010 |

OTHER PUBLICATIONS

Coddington, I. et al.,"Rapid and precise absolute distance measurements at long range", Nature Photonics, vol. 3, Jun. 2009.
Schibli, T.R. et al., "Displacement metrology with sub-pm resolution in air based on a fs-comb wavelength snthesizer", Optics Express 5984, vol. 14, No. 13, Jun. 2006.
Hyun, S. et al., "Absolute distance measurement using the frequency comb of a femtosecond laser", CIRP Annals—Manufacturing Technology 59, 2010, 555-558.
Ye, J., "Absolute measurement of a long, arbitrary distance to less than an optical fringe", Optics Letters, vol. 29, No. 10, May 15, 2004.
Schuhler, N. et al., "Frequency-comb-referenced two-wavelength source for absolute distance measurement", Optics Letters 31, issue 21, 3101-3103, 2006.
Chapman, M., "Heterodyne and homodyne interferometry", Renishaw 2002.
Bitou. Y. et al., "Accurate wide-range displacement measurement using tunable diode laser . . . ", Optics Express 644-654, vol. 14, No. 2, Jan. 23, 2006.
"Frequency comb", Wikipedia, Jul. 22, 2011.
Office Action in corresponding German Application No. 10 2012 212 663.5, dated Feb. 15, 2013, along with an English translation.
International Search Report in counterpart International Application No. PCT/EP2013/002074, mailed Jan. 27, 2014.
Written Opinion in counterpart International Application No. PCT/EP2013/002074.
Office Action in corresponding Chinese Application No. 201380038040.9, dated Mar. 3, 2016, along with an English translation.
Office Action in corresponding Chinese Application 201380038040.9, mailed Jan. 9, 2017, along with English Translation.
Office Action in corresponding Taiwanese Application 102125697, dated May 18, 2017, along with English Translation.
Official Action in corresponding Japanese Application 2015-521990, dated Jul. 4, 2017, along with English Translation.

* cited by examiner

PROJECTION EXPOSURE APPARATUS FOR MICROLITHOGRAPHY COMPRISING AN OPTICAL DISTANCE MEASUREMENT SYSTEM

CROSS-REFERENCE TO RELATED APPLICATIONS

This is a Continuation of International Application PCT/EP2013/002074, which has an international filing date of Jul. 12, 2013, and the disclosure of which is incorporated in its entirety into the present Continuation by reference. The following disclosure is also based on and claims the benefit of and priority under 35 U.S.C. §119(a) to German Patent Application No. DE 10 2012 212 663.5, filed Jul. 19, 2012, which is also incorporated in its entirety into the present Continuation by reference.

FIELD OF AND BACKGROUND OF THE INVENTION

The invention relates to a projection exposure apparatus for microlithography comprising a plurality of optical components forming an exposure beam path. Furthermore, the projection exposure apparatus comprises a distance measurement system. The invention furthermore relates to a method for distance measurement in a projection exposure apparatus for microlithography.

Highly productive projection exposure apparatus for microlithography react sensitively to vibration excitations, such as are produced during the scanning movement of reticle and wafer. Such vibration excitations lead to deflections of the optical components of the projection exposure apparatus with regard to the desired position thereof in the beam path, which leads to imaging aberrations. In accordance with one approach for minimizing these effects, the optical components are continuously measured with regard to their position. With regard to measured deflections, corresponding correction measures are implemented. Dynamic sensors on a capacitive basis or in the form of moving coils are envisaged for position measurement. Such sensors, in a manner governed by the design, have to be positioned very close to the area to be measured, which can cause drift, for example thermal drift, and impairs the measurement accuracy of the sensor. Moreover, these sensors can in turn have a disadvantageous effect on the dynamic behavior of the optical components.

OBJECTS AND SUMMARY

It is an object of the invention to provide a projection exposure apparatus for microlithography comprising a distance measurement system and also a method for distance measurement in a projection exposure apparatus whereby the abovementioned problems are addressed. A further object is providing a distance measurement that can be carried out on an optical component with improved accuracy, as far as possible without simultaneously impairing the dynamic behavior of the optical component. The distance measurement is preferably effected from a relatively large distance.

These objects are achieved according to one formulation of the invention with a projection exposure apparatus for microlithography comprising a plurality of optical components forming an exposure beam path. Furthermore, the projection exposure apparatus comprises a distance measurement system configured to measure a distance between at least one of the optical components and a reference element. The distance measurement system comprises a frequency comb generator, which is configured to generate electromagnetic radiation with a comb-shaped frequency spectrum.

A comb-shaped frequency spectrum is understood to mean a frequency spectrum having a plurality of discrete lines arranged with uniform spacing. Discrete lines in this context are lines whose line width is at most $\frac{1}{10}$, in particular at most $\frac{1}{100}$ or even more particularly at most $\frac{1}{1000}$, of the distance to the respectively adjacent line.

In other words, the distance measurement system according to the invention measures the distance between at least one of the optical components and the reference element with respect to at least one measurement point on the relevant optical component. An optical component can be, for example, a lens element or a mirror of the exposure beam path of the projection exposure apparatus. The distance measurement system comprises a frequency comb generator, which can be used in various ways, described in greater detail below, in the distance measurement system. The use of such a frequency comb generator makes it possible to carry out the distance measurement with a very high accuracy. Moreover, the measurement can be effected optically and thus contactlessly from a relatively large distance, as a result of which the dynamic behavior of the optical component is not impaired.

In accordance with one embodiment according to the invention, the distance measurement system is configured to measure the distance between the at least one optical component and the reference element with respect to a plurality of measurement points on the optical component. Furthermore, the distance measurement system comprises an evaluation device, which is configured to determine from the measurements a position of the optical component in relation to the reference element in a plurality of degrees of freedom. The degrees of freedom preferably comprise translations in the x-, y- and/or z-direction and/or tiltings or rotations about the x-, y- and/or z-axis. In accordance with one variant, the evaluation device is configured to determine the position in six degrees of freedom, i.e. in three degrees of freedom of translation and three degrees of freedom of rotation.

In accordance with a further embodiment according to the invention, the distance measurement system is configured to monitor the vibration behavior of the at least one optical component. For this purpose, the distance measurement is repeated at short time intervals. The vibration behavior then results from the distance variations determined over time.

In accordance with a further embodiment according to the invention, the frequency comb generator comprises a pulsed femtosecond laser. This is understood to mean a pulsed laser having a pulse duration in the femtoseconds range. This can be e.g. a mode-locked titanium-sapphire laser. Alternatively, a frequency comb generator can also be formed by a linear optical cavity containing an electro-optical modulator. Such a linear optical cavity is known e.g. from FIG. 3 and the associated description of the document by Youichi Bitou et al., "Accurate wide-range displacement measurement using tunable diode laser and optical frequency comb generator", Optics Express, Vol. 14, No. 2, 2006, pages 644-654.

In accordance with a further embodiment according to the invention, the frequency comb generator is configured to generate a pulsed measurement radiation with a comb-shaped frequency spectrum, and the distance measurement system comprises a further frequency comb generator, which is configured to generate pulsed comparison radiation likewise with a comb-shaped frequency spectrum, wherein the pulse rate of the comparison radiation differs from the pulse rate of the measurement radiation. In one variant of this embodiment, the reference element is configured to split a reference radiation from the measurement radiation. The distance measurement system furthermore comprises an irradiating device configured to irradiate the at least one optical component being measured with the measurement radiation. Furthermore, the distance measurement system comprises a superimposition element configured to superimpose the comparison radiation with the reference radiation and the measurement radiation after the interaction thereof with the at least one irradiated component. Furthermore, the distance measurement system comprises a detection device, which is configured to record a temporal profile of the intensity of the superimposition and to determine the distance between the irradiated component and the reference element from the detected intensity profile.

In accordance with a further embodiment according to the invention, the detection device is furthermore configured to determine a propagation time difference between the reference radiation and the measurement radiation and therefrom an approximate value for the distance between the irradiated component and the reference element. This approximate value can serve as an initial value for the distance, proceeding from which a more precise distance value can be determined by evaluation of a fine structure produced by superimposition of the frequency combs of the superimposed radiations. In accordance with a further embodiment according to the invention, in the projection exposure apparatus there is formed a measurement beam path extending over a plurality of the optical components such that at each of the affected optical components a respective portion of a measurement radiation is reflected back to the distance measurement system. In accordance with one variant, the detection device is configured to determine a respective propagation time difference between the reference radiation and the respective reflected measurement radiation and to determine from the determined propagation time differences the relative arrangement of the affected optical components with respect to one another in the exposure beam path.

In accordance with a further embodiment according to the invention, the at least one optical component to be measured has a probe element, which is configured to reflect a portion of an incident measurement radiation back on itself and to reflect a further portion of the incident measurement radiation on to a further one of the optical components. In accordance with one variant, the at least one optical component to be measured has a plurality of such probe elements arranged in a ring-shaped manner along the edge of the irradiated optical component.

In accordance with a further embodiment according to the invention, the distance measurement system further comprises an irradiating device having a plurality of measurement radiation sources, wherein the individual measurement radiation sources are arranged to irradiate the at least one optical component to be measured with the measurement radiation at mutually different points.

In accordance with a further embodiment according to the invention, the distance measurement system comprises an optical resonator arranged between the reference element and the optical component to be measured. Such a resonator can be formed by two mirrors, of which one is arranged at the reference element and the other is arranged at the optical component to be measured. In accordance with one variant, the optical resonator is embodied as a Fabry-Perot resonator.

In accordance with a further embodiment according to the invention, the distance measurement system comprises a wavelength-tunable radiation source and a coupling device, which is configured to couple the optical frequency of the tunable radiation source to the resonant frequency of the optical resonator. Therefore, the optical frequency of the tunable radiation source follows the resonant frequency of the optical resonator in terms of the temporal profile.

In accordance with a further embodiment according to the invention, the distance measurement system furthermore comprises a frequency measuring device, which comprises the frequency comb generator and is configured to measure the optical frequency of the tunable radiation source. The distance of the mirrors of the optical resonator can be determined from the measured optical frequency.

In accordance with a further embodiment according to the invention, the distance measurement system comprises an irradiating device configured to irradiate the at least one optical component to be measured with measurement radiation having at least two optical frequencies of the comb-shaped frequency spectrum. Furthermore, the distance measurement system can comprise an interferometer, which is configured to evaluate the measurement radiation after interaction with the optical component to be measured using multiple wavelength interferometry.

In accordance with a further embodiment according to the invention, the distance measurement system is configured to carry out wavelength scanning interferometry. Both multiple wavelength interferometry mentioned above and wavelength scanning interferometry are known to the person skilled in the art e.g. from the document by S. Hyun et al., "Absolute distance measurement using the frequency comb of a femtosecond laser", CIRP Annals—Manufacturing Technology 59 (2010), pages 555-558. In the document, multiple wavelength interferometry is designated as MWI, and wavelength scanning interferometry as WSI, and are described for example in the second section entitled "Multi-wavelength generation" extending over pages 555 to 557.

In accordance with a further embodiment according to the invention, the projection exposure apparatus is configured for operation with EUV radiation. This should be understood to mean a projection exposure apparatus which uses EUV radiation as exposure radiation to image mask structures onto a substrate. EUV radiation should be understood to mean radiation having a wavelength of less than 100 nm, in particular having a wavelength of approximately 13.5 nm or approximately 6.8 nm. In accordance with an alternative embodiment, the projection exposure apparatus can also be configured to operate with VUV radiation, i.e. radiation having a wavelength of e.g. 193 nm, 248 nm or 365 nm.

A method for distance measurement in a projection exposure apparatus for microlithography is furthermore provided according to the invention. The projection exposure apparatus comprises a plurality of optical components forming an exposure beam path. The method comprises: generating an electromagnetic radiation with a comb-shaped frequency spectrum, and measuring a distance between at least one of the optical components and a reference element of the projection exposure apparatus for microlithography using the radiation with the comb-shaped frequency spectrum.

In accordance with embodiments according to the invention, the measurement is effected with a distance measurement system in one of the embodiments described above.

The features indicated with respect to the abovementioned embodiments of the projection exposure apparatus according to the invention can correspondingly be applied to the method according to the invention.

BRIEF DESCRIPTION OF THE DRAWINGS

The above, and also further advantageous features of the invention are illustrated in the following detailed description of exemplary embodiments according to the invention with reference to the accompanying schematic drawings, in which.

DETAILED DESCRIPTION OF EXEMPLARY EMBODIMENTS

In the exemplary embodiments or embodiments described below, elements that are functionally or structurally similar to one another are as far as possible provided with the same or similar reference signs. Therefore, for an understanding of the features of the individual elements of a specific exemplary embodiment, reference should be made to the description of other exemplary embodiments or the general description of the invention.

Figure 1:
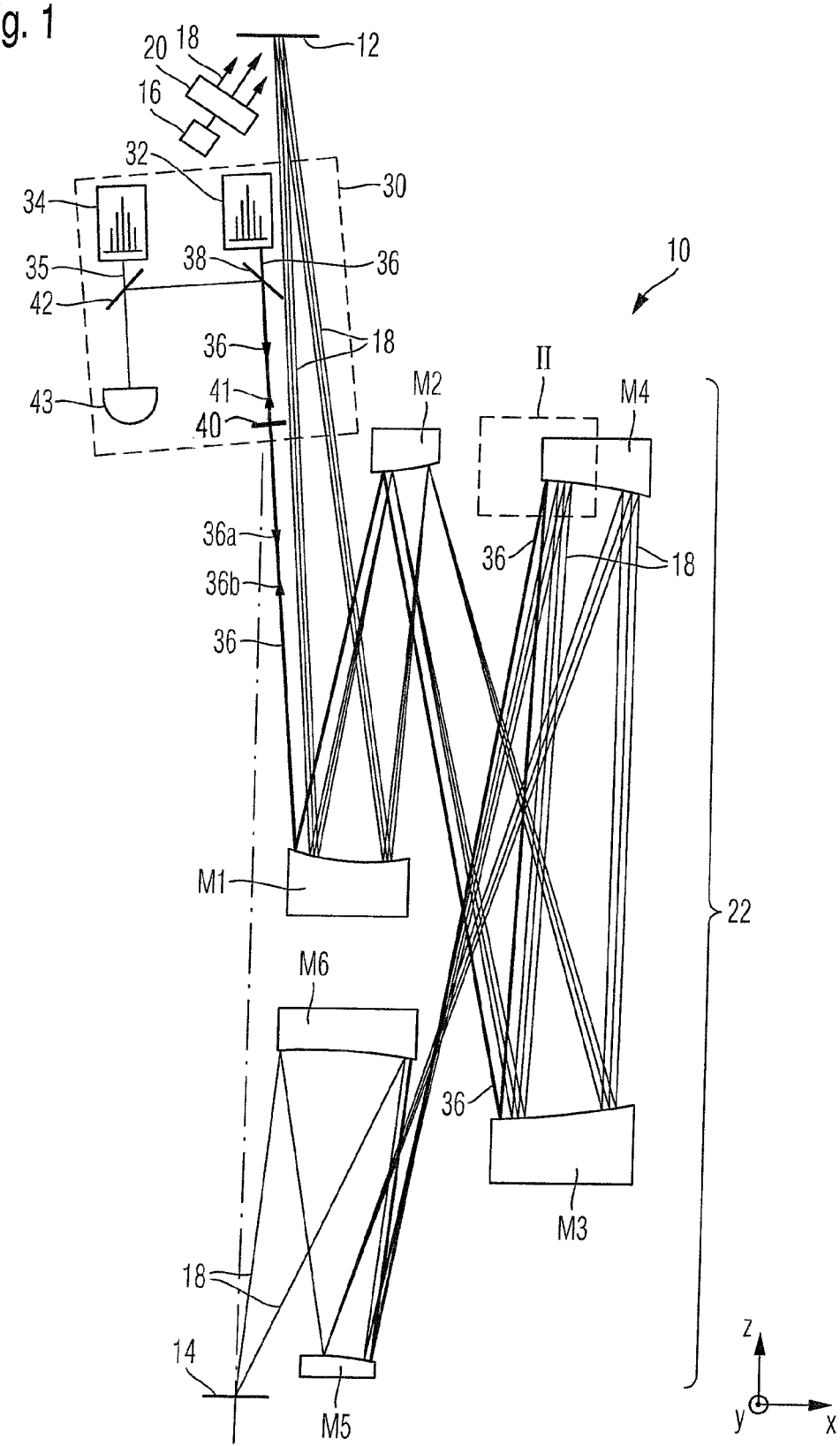
FIG. 1 shows a projection exposure apparatus for microlithography comprising an optical distance measurement system integrated therein in one embodiment according to the invention, which measures a distance between one or a plurality of optical components of the projection exposure apparatus and a reference element and comprises two frequency comb generators.

In order to facilitate the description of the projection exposure apparatus, the drawing indicates a Cartesian xyz coordinate system that reveals the respective positional relationship of the components illustrated in the figures. In FIG. 1, the y-direction runs perpendicular to the plane of the drawing out of the latter, the x-direction runs toward the right, and the z-direction runs upward.

FIG. 1 illustrates an embodiment of a projection exposure apparatus 10 for microlithography. The projection exposure apparatus 10 serves to image mask structures arranged on a reticle 12 onto a substrate 14 in the form of a wafer. For this purpose, the reticle 12 is illuminated with exposure radiation 18. The exposure radiation 18 is generated by an exposure radiation source 16 and is radiated onto the reticle 12 with an illumination optical unit 20. In the case illustrated, the wavelength of the exposure radiation 18 is in the extreme ultraviolet (EUV) wavelength range and thus at a wavelength of less than 100 nm, e.g. a wavelength of 13.5 nm or 6.8 nm. Alternatively, the wavelength of the exposure radiation can also be in the UV wavelength range, for example at 365 nm, 248 nm or 193 nm.

The imaging of the mask structures from the reticle 12 onto the substrate 14 is effected with a projection lens 22. After passing through the projection lens 22, the exposure radiation 18 is guided into an exposure beam path by optical components M1 to M6. In the present case, in which EUV radiation serves as exposure radiation 18, the optical components M1 to M6 are embodied as mirrors.

Furthermore, an optical distance measurement system 30 is integrated into the projection exposure apparatus 10. The distance measurement system 30 is configured to measure the distance between at least one of the optical components M1 to M6 and a reference element 40. In the case illustrated, the distance measurement system 30 serves to measure the distance between each individual one of the optical components and the reference element 40. In this case, the distance measurement can be effected with respect to one measurement point on the respective optical component M1 to M6 or else with respect to a plurality of measurement points on the optical components M1 to M6. Depending on the number of measurement points, with the distance measurement a position of the respective optical components M1 to M6 in relation to the reference element 40 is determined in one or a plurality of degrees of freedom. In accordance with one embodiment, the determination is effected in all six degrees of freedom of a rigid-body movement, i.e. with regard to x-, y- and z-translation and tilting or rotations about the x-, y- and z-axes. The distance measurement system 30 is configured, in particular, to measure the position of the individual optical components in the temporal profile and thus to monitor a vibration behavior of the optical components M1 to M6. The optical distance measurement system 30 comprises a measurement radiation source in the form of a first frequency comb generator 32 configured to generate a pulsed measurement radiation 36. The frequency comb generator 32 can comprise, for example, a pulsed femtosecond laser known to the person skilled in the art, for instance in the form of a mode-locked titanium-sapphire laser.

Figure 6A:
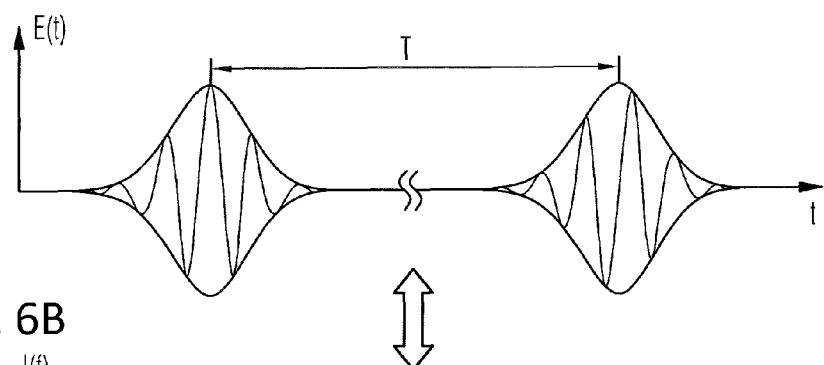
Figure 6B:
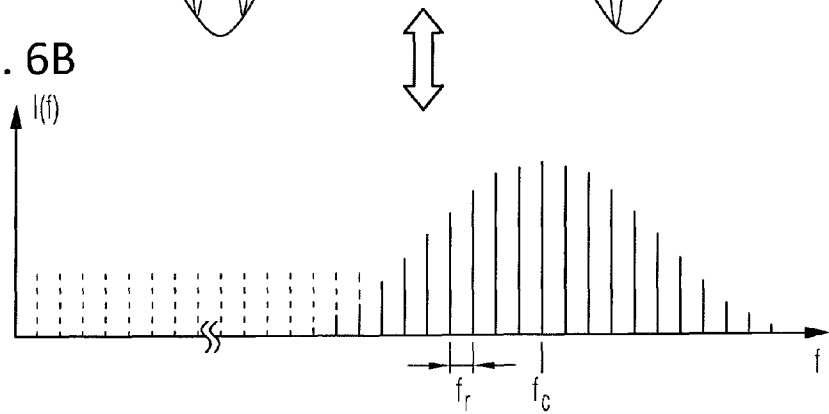

FIGS. 6A and 6B show two diagrams arranged one above the other. The upper diagram (FIG. 6A) shows by way of example the temporal profile E(t) of the field strength of the measurement radiation 36 generated by the frequency comb generator 32. As can be seen from the diagram, the measurement radiation 36 contains pulses succeeding one another with a period interval of T. The reciprocal value of the period interval T is designated as the pulse repetition frequency $f_r$. The lower diagram in FIG. 6 (FIG. 6B) illustrates the intensity distribution I(f) of the measurement radiation 36 as a function of the optical frequency f. As can be seen from the diagram, the frequency spectrum is comb-shaped, i.e. the frequency spectrum has a multiplicity of discrete lines arranged in each case with the spacing of $f_r$. The intensity of the individual lines rises up to a maximum value at the frequency $f_c$ and then falls again. The conversion between the diagram of the electric field strength and the diagram of the intensity can be carried out with a Fourier transformation.

The measurement radiation 36 generated by the frequency comb generator 32 in accordance with FIG. 1 firstly impinges on a reference element 40, which is configured to reflect a portion of the measurement radiation 36 back on itself in the form of a reference radiation 41. The remaining portion of the measurement radiation 36 passes through the reference element 40 unchanged. This portion of the measurement radiation 36 thereupon passes through the projection lens 22 in a measurement beam path provided therefor as far as the sixth optical component M6. In this case, the measurement radiation 36 impinges on each of the optical components M1 to M6. At each of the optical components M1 to M5, a portion 36b of the respectively incident measurement radiation 36a is reflected back on itself, while the respectively remaining portion 36b of the measurement radiation 36a is forwarded to the respectively next optical component. At the optical component M6, the measurement radiation 36a incident there is completely reflected.

Figure 2:
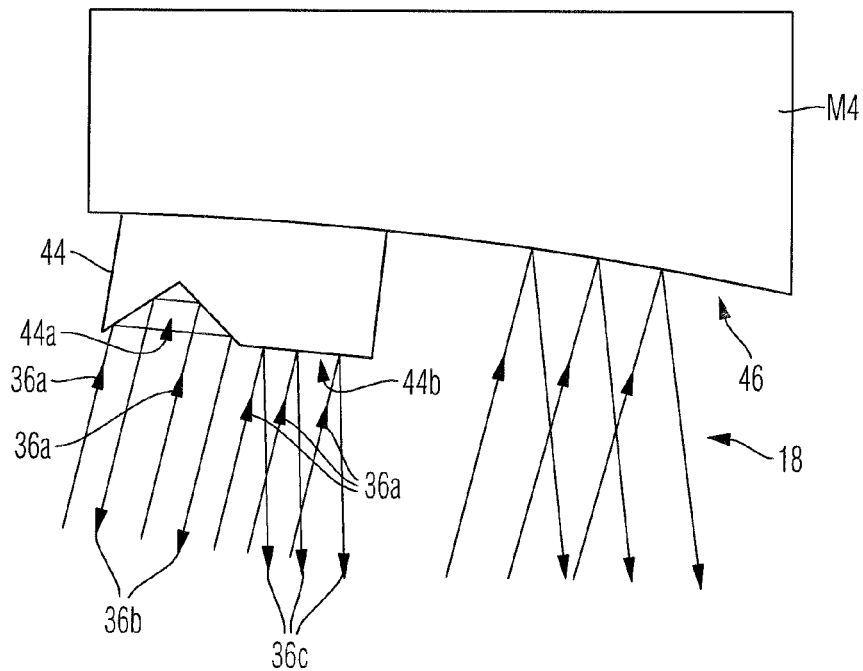
FIG. 2 shows the region identified by II in FIG. 1 in greater detail.

For reflecting back or forwarding the measurement radiation 36, the optical components M1 to M6 each have at least one probe element 44. Such a probe element 44 is illustrated in FIG. 2 on the basis of the example of the optical component M4 of the projection lens 22 from FIG. 1. FIG. 2 shows the section designated by II in FIG. 1 in detail. The probe element 44 is arranged at an edge region of the component M4 on the side of a mirror surface for the exposure radiation 18. A used surface 46 of the mirror surface is directly adjacent to the probe element 44.

The probe element 44 has a first reflective section 44a and a second reflective section 44b. The first reflective section 44a reflects the incident measurement radiation 36a back on itself. The measurement radiation 36b reflected back on itself thus has a beam direction opposite to the beam direction of the incident measurement radiation 36a. The second reflective section 44b reflects that portion of the incident measurement radiation 36a which impinges thereon on to the optical component arranged downstream in the beam path, the component M5 in the present case. The radiation reflected in this case is designed as forwarded measurement radiation 36c, and the measurement radiation 36c subsequently impinges on a corresponding probe element 44 on the component M5. The measurement radiation 36b reflected back on itself at the respective optical components M1 to M6 passes through the measurement beam path in the opposite direction and finally enters into the distance measurement system 30 again, where it passes through the reference element 40 and is thereupon directed together with the reference radiation 41 via a beam splitter 38 onto a superimposition element 42 in the form of a further beam splitter. With the aid of the superimposition element 42, the combination of measurement radiation 36b and reference radiation 41 is superimposed with a comparison radiation 35 on a detection device 43.

The comparison radiation 35 is generated by a second frequency comb generator 34, which forms a so-called "local" oscillator. The frequency comb generator 34 is constructed analogously to the frequency comb generator 32. The comparison radiation 35 generated by the frequency comb generator 34 differs from the measurement radiation 36 generated by the frequency comb generator 32 merely in the pulse rate. In the detection device 43, the respective distance between the individual optical components M1 to M6 in the measurement beam path and the reference element 40 is calculated from the superimposition of the comparison radiation 35 with the measurement radiation 36b and the reference radiation 41.

In doing so, propagation time differences between the pulses of the reference radiation 41 and the pulses of the measurement radiation 36b reflected back by the individual optical components M1 to M6 are firstly determined. From the propagation time differences determined, the measured pulses of the measurement radiation 36b can be assigned to the individual optical components M1 to M6. At the same time a respective initial value for the distance between the reference element 40 and the individual optical components M1 to M5 is determined from the propagation time measurement. Furthermore, proceeding from the respective initial value, a highly precise value for the distance between the reference element 41 and the respective optical components M1 to M6 is thereupon determined by evaluation of a fine structure produced by the superimposition of the frequency combs from comparison radiation 35 and measurement radiation 36b.

The basic construction and the fundamental functioning of the distance measurement system 30 are described in one possible embodiment in the document by 1. Coddington et al., "Rapid and precise absolute distance measurements at long range", Nature Photonics, Vol. 3, June 2009, pages 351-356. In this regard, FIG. 1 of the document shows under (a) the measurement beam path, under (c) the measurement data used for the propagation time measurement, and under (b) the fine structure evaluated for precise distance determination. Details regarding the configuration of the measurement system 30 are therefore known to the person skilled in the art from the document by Coddington et al. This document in its entire scope, and in particular with regard to the description concerning FIG. 1, is incorporated hereby into the disclosure of this application.

In accordance with a further embodiment, the distance measurement system 30 in accordance with FIG. 1 is embodied without the second frequency comb generator 34. In other words, a local oscillator is dispensed with, but instead the repetition rate of the frequency comb generator 32 that generates the measurement radiation 36 can be manipulated. This embodiment of the measurement system 30 can be configured for example as described in the document by Jun Ye, "Absolute measurement of a long, arbitrary distance to less than an optical fringe", Optics Letters, Vol. 29, No. 10, May 15, 2004, pages 1153-1155. The content of this document is likewise incorporated hereby into the disclosure of this application.

Figure 4:
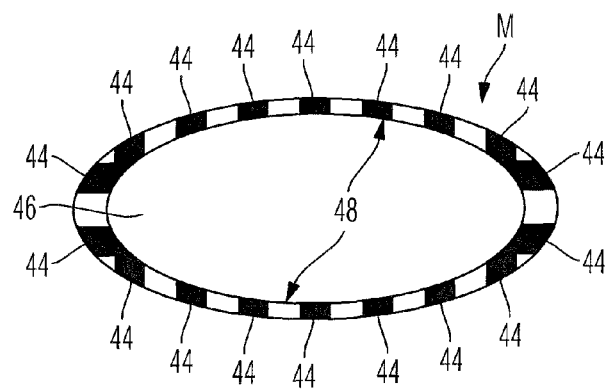
FIG. 4 shows a plan view of an optical component of the projection exposure apparatus in accordance with FIG. 1 with probe elements arranged thereon to irradiate with measurement radiation generated by the optical distance measurement system.

As already mentioned above, in accordance with one embodiment, one or a plurality of the optical components M1 to M6 of the projection exposure apparatus 10 in accordance with FIG. 1 have not just one probe element 44 to reflect the measurement radiation 36, but rather a plurality of such probe elements 44. FIG. 4 shows an exemplary embodiment of such an optical component M having a multiplicity of probe elements 44. The probe elements 44 are arranged in a ring-shaped edge region of the reflective surface of the optical component M embodied as a mirror. The ring-shaped edge region of the optical component M is designated as measurement radiation guiding region 48 and surrounds a used surface 46 configured to reflect the exposure radiation 18. As can be seen from FIG. 4, the probe elements 44 are arranged substantially at a uniform distance from one another.

Figure 3:
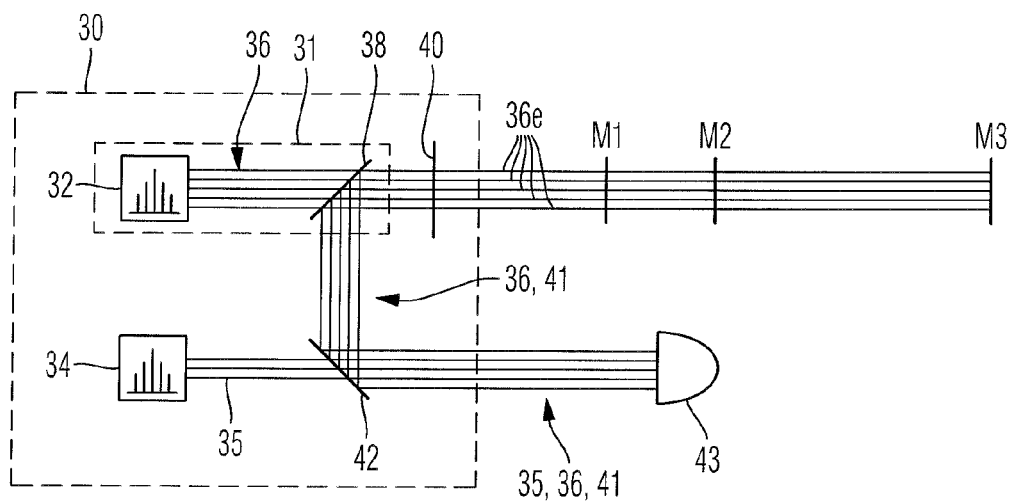
FIG. 3 shows an illustration of a measurement beam path serving for distance measurement in accordance with FIG. 1 in an embodiment according to the invention.
Figure 5:
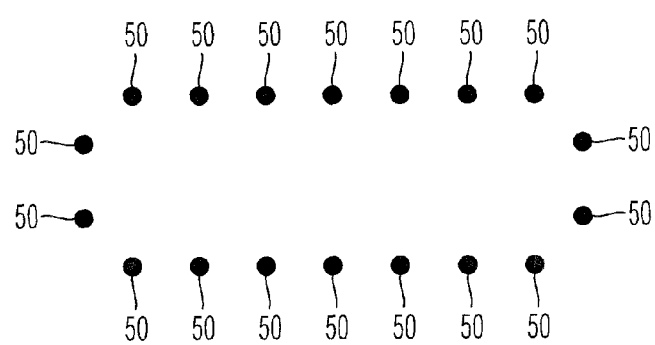
FIG. 5 shows an exemplary arrangement of a multiplicity of measurement radiation sources in the distance measurement system from FIG. 1, FIGS. 6A and 6B show an exemplary illustration of the electric field strength of a radiation generated by one of the frequency comb generators from FIG. 1 over time (FIG. 6A) and also the intensity of the measurement radiation as a function of the optical frequency (FIG. 6B)

FIG. 3 schematically illustrates the embodiment of the measurement system 30 configured to activate a plurality of probe elements 44 on the respective optical components M. For the sake of simplified illustration, FIG. 3 illustrates only three optical components M1 to M3. The first frequency comb generator 32 generates the measurement radiation 36 in a plurality of individual measurement beams 36e. Each of the measurement beams 36e respectively probes a probe element 44 on each of the optical components M1 to M3, as illustrated by way of example for one probe element 44 in FIG. 2. With regard to each of the individual measurement beams 36e, a respective individual beam of the reference radiation 41 and of the comparison radiation 35 are superimposed and evaluated by the detection device 36, as already described above. The measurement system 30 in accordance with FIG. 3 thus comprises an irradiating device 31 that irradiates the optical components M1 to M6 with the measurement radiation 36. The irradiating device 31 comprises a multiplicity of measurement radiation sources 50 that each generate a measurement beam 36e. FIG. 5 shows an embodiment of an arrangement of such measurement radiation sources 50 in a plane transversely with respect to the direction of propagation of the measurement radiation 36. The measurement radiation sources serve to irradiate optical components M in the embodiment illustrated in FIG. 4.

As already mentioned above, in the projection exposure apparatus 10 in accordance with FIG. 1, it is also possible for only a portion of the optical components M1 to M6, e.g. one, two, three, four or five optical components, to be provided with in each case one or a plurality of probe elements 44.

Figure 7:
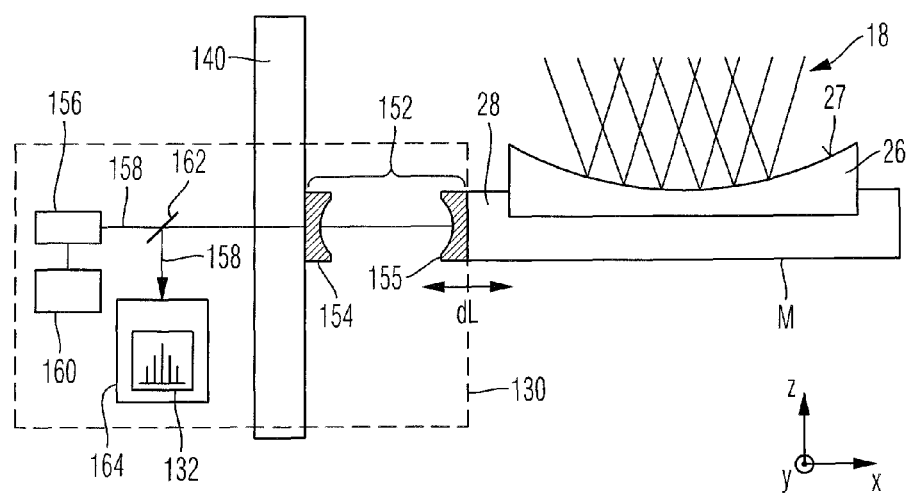
FIG. 7 shows a further embodiment according to the invention of an optical distance measurement system for use in the projection exposure apparatus from FIG. 1.

FIG. 7 shows a further configuration 130 according to the invention of an optical distance measurement system. Like the distance measurement system 30, the distance measurement system 130 is configured to measure a distance between at least one component M of a projection exposure apparatus for microlithography, for example of the type illustrated in FIG. 1, and a reference element. In the embodiment in accordance with FIG. 7, the reference element is a measurement frame 140, which can be connected for example fixedly to the housing of the projection lens 22 of the projection exposure apparatus 10.

The measurement system 130 in accordance with FIG. 7 comprises an optical resonator 152 in the form of a Fabry-Perot resonator. The optical resonator 152 comprises two resonator mirrors 154 and 155, of which the first resonator mirror 154 is fixed to the reference element 140 and the second resonator mirror 155 is fixed to the optical component M. In the case illustrated, the optical component M is a mirror for EUV lithography and comprises a mirror mount 28 and also a mirror element 26 held by it and having a mirror surface 27 configured to reflect the exposure radiation 18. In accordance with one embodiment, the resonator mirror 155 is fixed to the mirror mount 28, in particular an edge region thereof. The distance between the resonator mirrors 154 and 155 is preferably greater than 10 cm, as a result of which a thermal and dynamic coupling between the optical component M and the reference element 140 is minimized.

The distance measurement system 130 comprises a radiation source which is tunable with regard to its optical frequency, e.g. in the form of a diode laser with an external cavity. The tunable radiation source 156 generates an input coupling radiation 158, which passes through a beam splitter 162 and is thereupon coupled into the optical resonator 152. In this case, the radiation source 156 is controlled by a coupling device 160 such that the optical frequency of the radiation source 156 is tuned to the resonant frequency of the optical resonator 152 and is thus coupled to the resonant frequency. One example of a technical realization of the coupling of the tunable radiation source 156 to the optical resonator 152 is described in the document Youichi Bitou et al. "Accurate wide-range displacement measurement using tunable diode laser and optical frequency comb generator" Optics Express, Vol. 14, No. 2, 2006, pages 644-654. In this respect, reference is made, in particular, to FIG. 1 and the associated description in the cited document.

In the embodiment in accordance with FIG. 7, the input coupling radiation 158 is coupled out of the resonator beam path with a beam splitter 162 and analyzed with an optical frequency measuring device 164. The optical frequency measuring device 164 comprises a frequency comb genera-tor 132 and is configured to measure the absolute optical frequency of the input coupling radiation 158 with high accuracy. The abovementioned document by Youichi Bitou et al. shows in FIG. 3 an example of the embodiment of the optical frequency measuring device 164. In this case, a linear optical cavity comprising an electro-optical modulator is used as the frequency comb generator. Alternatively, it is conceivable to use the femtosecond laser already described above as the frequency comb generator 132.

The entire disclosure of the document by Youichi Bitou et al., in particular FIGS. 1 and 3 together with description referring thereto, is incorporated by express reference in the disclosure of this application. Furthermore, the distance measurement system 130 can also be designed on the basis of that in the document by T. R. Schibli et al., "Displacement metrology with sub-pm resolution in air based on a fs-comb wavelength synthesizer", Optics Express, Vol. 14, No. 13, pages 5984-5993. The entire disclosure of this document is likewise incorporated by reference into the disclosure of the present application.

If the position of the optical component M changes in the x-direction, then the distance between the resonator mirrors 154 and 155 changes, as a result of which the resonant frequency of the optical resonator 152 likewise changes. As a result of the coupling of the optical frequency of the tunable radiation source 156 to the resonant frequency of the optical resonator 152, the optical frequency of the input coupling radiation 158 also changes in this case. Such a change in the optical frequency is registered directly by the optical frequency measuring device 164. From the measurement signal of the frequency measuring device 164, vibrations of the optical component M can thus be monitored with high accuracy.

Figure 8:
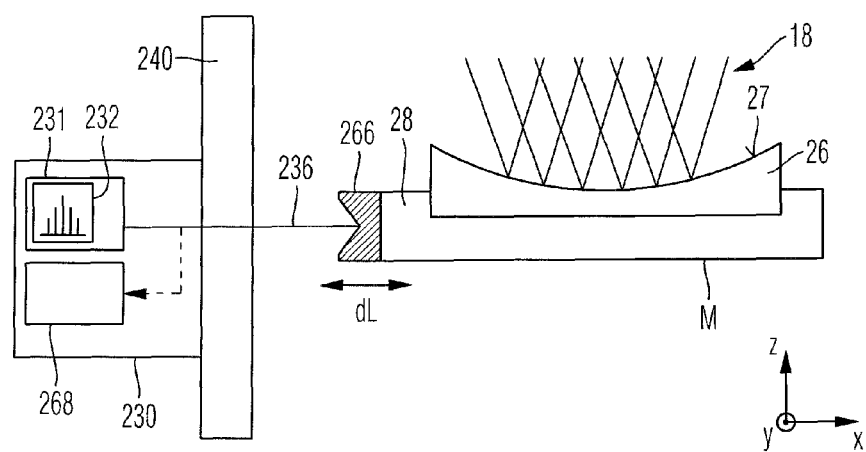
FIG. 8 shows yet another embodiment according to the invention of an optical distance measurement system for use in the projection exposure apparatus from FIG. 1.

FIG. 8 shows a further embodiment 230 according to the invention of an optical distance measurement system for a projection exposure apparatus for microlithography. The distance measurement system 230 in accordance with FIG. 8 serves, analogously to the distance measurement system 130 in accordance with FIG. 7, to measure the distance between at least one optical component M of a projection exposure apparatus 10 and a reference element 240 in the form of a measurement frame.

For distance measurement with the aid of the distance measurement system 230 in accordance with FIG. 8, the optical component M, which is an EUV mirror in the case illustrated, analogously to the embodiment in accordance with FIG. 7, is provided with a retroreflector 266. Like the resonator mirror 155 in accordance with FIG. 7, the retroreflector 266 is fixed to the mirror mount 28 of the optical component M. The optical distance measurement system 230 comprises an irradiating device 231 having a frequency comb generator 232. The latter, like the frequency comb generators already described above, can comprise a femtosecond laser, for example.

The frequency comb generator 232 generates a radiation with a comb-shaped frequency spectrum. A plurality of frequencies of this frequency spectrum are thereupon selected by the irradiating device 231 and radiated in the form of a measurement radiation 236 onto the retroreflector 266. The irradiating device 231 thus constitutes a multiple-wavelength light source. The measurement radiation 236 is reflected back on itself by the retroreflector 266 and analyzed with an interferometer 268. This analysis comprises, on the one hand, multiple wavelength interferometry and, on the other hand, wavelength scanning interferometry. A highly precise measurement value of the distance between the retroreflector 266 and the reference element 240 to which the distance measurement system 230 is fixed is determined from the result of this analysis.

One example of the principle underlying the optical distance measurement system 230 and the technical realization thereof is described in the document by S. Hyun et al., "Absolute distance measurement using the frequency comb of a femtosecond laser", CIRP Annals—Manufacturing Technology 59 (2010), pages 555-558. From this document the person skilled in the art knows especially about the method of multiple wavelength interferometry (MWI) and wavelength scanning interferometry (WSI). The content of this document, in particular the content of FIG. 5 and of the associated description, is incorporated by reference into the disclosure of the present application.

LIST OF REFERENCE SIGNS

M1-M6 optical components
10 projection exposure apparatus
12 reticle
14 substrate
16 exposure radiation source
18 exposure radiation
20 illumination optical unit
22 projection lens
26 mirror element
27 mirror surface
28 mirror mount
30 distance measurement system
31 irradiating device
32 first frequency comb generator
34 second frequency comb generator
35 comparison radiation
36 measurement radiation
36a incident measurement radiation
36b measurement radiation reflected back on itself
36c forwarded measurement radiation
36e individual measurement beam
38 beam splitter
40 reference element
41 reference radiation
42 superimposition element
43 detection device
44 probe element
44a first reflective section
44b second reflective section
46 used surface
48 measurement radiation guiding region
50 measurement radiation source
130 distance measurement system
132 frequency comb generator
140 reference element
152 optical resonator
154 resonator mirror
155 resonator mirror
156 tunable radiation source
158 input coupling radiation
160 coupling device
162 beam splitter
164 frequency measuring device
230 distance measurement system
231 irradiating device
232 frequency comb generator
236 measurement radiation
240 reference element
266 retroreflector
268 interferometer

The invention claimed is:

1. A projection exposure apparatus for microlithography comprising:
   a projection lens and/or an illumination system comprising a plurality of optical components forming an exposure beam path, and
   a distance measurement system configured to measure a distance between at least one of the optical components and a reference element,
   wherein the distance measurement system comprises a frequency comb generator configured to generate electromagnetic radiation with a comb-shaped frequency spectrum.

2. The projection exposure apparatus according to claim 1,
   wherein the distance measurement system is configured to monitor a vibration behavior of the at least one optical component.

3. The projection exposure apparatus according to claim 1,
   wherein the frequency comb generator comprises a pulsed femtosecond laser.

4. The projection exposure apparatus according to claim 1,
   wherein the frequency comb generator is configured to generate a pulsed measurement radiation with a comb-shaped frequency spectrum, and the distance measurement system comprises a further frequency comb generator, which is configured to generate pulsed comparison radiation with a further comb-shaped frequency spectrum, wherein the comparison radiation has a pulse rate that differs from a respective pulse rate of the measurement radiation.

5. The projection exposure apparatus according to claim 4,
   wherein the reference element is configured to split a reference radiation from the measurement radiation, and the distance measurement system further comprises:
   an irradiating device configured to irradiate the at least one optical component with the measurement radiation,
   a superimposition element configured to superimpose the comparison radiation with the reference radiation and the measurement radiation after interaction thereof with the at least one irradiated component, and
   a detection device configured to record a temporal profile of an intensity of the superimposition and to determine the distance between the irradiated component and the reference element from the detected intensity profile.

6. The projection exposure apparatus according to claim 5,
   wherein the detection device is further configured to determine a propagation time difference between the reference radiation and the measurement radiation and to determine from the time difference an approximate value for the distance between the irradiated component and the reference element.

7. The projection exposure apparatus according to claim 1,
   wherein a measurement beam path extending over an affected plurality of the optical components is formed such that at each of the affected optical components a respective portion of a measurement radiation is reflected back to the distance measurement system.

8. The projection exposure apparatus according to claim 1,
wherein the at least one optical component comprises a probe element, which is configured to reflect a portion of an incident measurement radiation back on itself and to reflect a further portion of the incident measurement radiation onto a further one of the optical components.

9. The projection exposure apparatus according to claim 1,
wherein the distance measurement system further comprises an irradiating device having a plurality of measurement radiation sources, wherein the measurement radiation sources are arranged to irradiate the at least one optical component with the measurement radiation at mutually different points of the at least one optical component.

10. The projection exposure apparatus according to claim 1,
wherein the distance measurement system further comprises an optical resonator arranged between the reference element and the at least one optical component.

11. The projection exposure apparatus according to claim 10,
wherein the distance measurement system further comprises a wavelength-tunable radiation source and a coupling device configured to couple an optical frequency of the tunable radiation source to a resonant frequency of the optical resonator.

12. The projection exposure apparatus according to claim 11,
wherein the distance measurement system further comprises a frequency measuring device, which comprises the frequency comb generator and is configured to measure the optical frequency of the tunable radiation source.

13. The projection exposure apparatus according to claim 1,
wherein the distance measurement system further comprises:
an irradiating device configured to irradiate the at least one optical component with measurement radiation having at least two optical frequencies of the comb-shaped frequency spectrum, and
an interferometer configured to evaluate the measurement radiation after interaction with the at least one optical component via multiple wavelength interferometry.

14. The projection exposure apparatus according to claim 13,
wherein the distance measurement system is configured to perform wavelength scanning interferometry.

15. The projection exposure apparatus according to claim 1,
which is configured for operation with extreme ultraviolet (EUV) radiation.

16. The projection exposure apparatus according to claim 1,
wherein the distance measurement system is configured to measure respective distances between a plurality of measurement points on the plurality of optical components and the reference element, and
wherein the distance measurement system further comprises an evaluation device, which is configured to determine from the respective distances a position of at least one of the plurality of optical components in relation to the reference element in at least one degree of freedom.

17. A projection exposure apparatus for microlithography, comprising:
a plurality of optical components forming an exposure beam path, and
a distance measurement system configured to measure a distance between at least one of the optical components and a reference element, wherein the distance measurement system comprises a frequency comb generator configured to generate electromagnetic radiation with a comb-shaped frequency spectrum,
wherein the distance measurement system is configured to measure respective distances between a plurality of measurement points on the at least one optical component and the reference element, and
wherein the distance measurement system further comprises an evaluation device, which is configured to determine from the respective distances a position of the at least one optical component in relation to the reference element in a plurality of degrees of freedom.

18. A method for distance measurement in a projection exposure apparatus for microlithography comprising a plurality of optical components forming an exposure beam path, comprising:
arranging a distance measurement system in the projection exposure apparatus,
generating electromagnetic radiation having a comb-shaped frequency spectrum, and
measuring a distance between at least one of the optical components of the projection exposure apparatus and a reference element using the radiation having the comb-shaped frequency spectrum.

19. The method according to claim 18, further comprising:
providing at least one probe element for the at least one optical component, wherein said measuring comprises measuring between the at least one probe element and the reference element.

20. The method as claimed in claim 18, wherein said arranging comprises arranging the reference element in fixed relation to at least one of the optical components of the projection exposure apparatus.

* * * * *

UNITED STATES PATENT AND TRADEMARK OFFICE
CERTIFICATE OF CORRECTION

PATENT NO. : 9,759,550 B2  
APPLICATION NO. : 14/598913  
DATED : September 12, 2017  
INVENTOR(S) : Alexander Wolf et al.

Page 1 of 1

It is certified that error appears in the above-identified patent and that said Letters Patent is hereby corrected as shown below:

On the Title Page

Item (74) Delete "Edell, Shapiro 7 Finnan, LLC" and insert --Edell, Shapiro & Finnan, LLC--, therefor.

In the Specification

Column 8, Line 12, Delete "1." and insert --I.--, therefor.

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*